United States Patent
Soman et al.

(10) Patent No.: US 6,237,130 B1
(45) Date of Patent: May 22, 2001

(54) CHIP LAYOUT FOR IMPLEMENTING ARBITRATED HIGH SPEED SWITCHING ACCESS OF PLURALITIES OF I/O DATA PORTS TO INTERNALLY CACHED DRAM BANKS AND THE LIKE

(75) Inventors: Satish Soman, Shrewsbury; Zbigniew Opalka, Harvard; Mukesh Chatter, Hopkinton, all of MA (US)

(73) Assignee: Nexabit Networks, Inc., Marlborough, MA (US)

( * ) Notice: Subject to any disclaimer, the term of this patent is extended or adjusted under 35 U.S.C. 154(b) by 0 days.

(21) Appl. No.: 09/182,268

(22) Filed: Oct. 29, 1998

(51) Int. Cl.[7] .............................. G06F 17/50; G06F 12/00; G06F 13/00
(52) U.S. Cl. ............................... 716/10; 716/12; 711/101; 710/129; 365/185.11
(58) Field of Search ................. 716/1–21; 711/101–109; 710/129; 365/185.11–185.13

(56) References Cited

U.S. PATENT DOCUMENTS

| | | | |
|---|---|---|---|
| 5,438,681 | * 8/1995 | Mensch, Jr. ............................. | 716/17 |
| 5,890,195 | * 3/1999 | Rao ...................................... | 711/105 |
| 5,953,738 | * 9/1999 | Rao ...................................... | 711/105 |
| 6,088,760 | * 7/2000 | Walker et al. ......................... | 711/104 |
| 6,088,785 | * 7/2000 | Hudson et al. ........................ | 712/35 |

OTHER PUBLICATIONS

Heshami et al., "A 250–MHZ Skewed–Clock Pipelined Data Buffer", IEEE Journal of Solid–State Circuits, vol. 31, No. 3, Mar. 1996, pp. 376–383.*

Heshami et al., "A 250–MHZ Skewed–Clock Pipelined Dual–Port Embedded DRAM", IEEE 1995 Custom Integrated Circuits Conference, Jan. 1995, pp. 143–146.*

* cited by examiner

Primary Examiner—Matthew Smith
Assistant Examiner—Phallaka Kik
(74) Attorney, Agent, or Firm—Rines and Rines

(57) ABSTRACT

A novel chip layout for a network wherein pluralities of I/O data ports are each connected to transmit/receive SRAM buffer banks operable under arbitration units to access pluralities of internally cached DRAM banks via internal busses to enable switching data connections amongst all data ports through the appropriate buffers, the chip layout having, data ports substantially symmetrically placed with each data port connected to each arbitration unit and each transmit/receive buffer bank, and with each data port enabled to write into any DRAM bank, with the connections being effected such that each data port is substantially symmetric with respect to DRAM bank, arbitration unit and transmit/receive buffer banks and busses; and with timing clocks centrally placed on the chip to minimize clock skew by symmetric clock distribution.

14 Claims, 1 Drawing Sheet

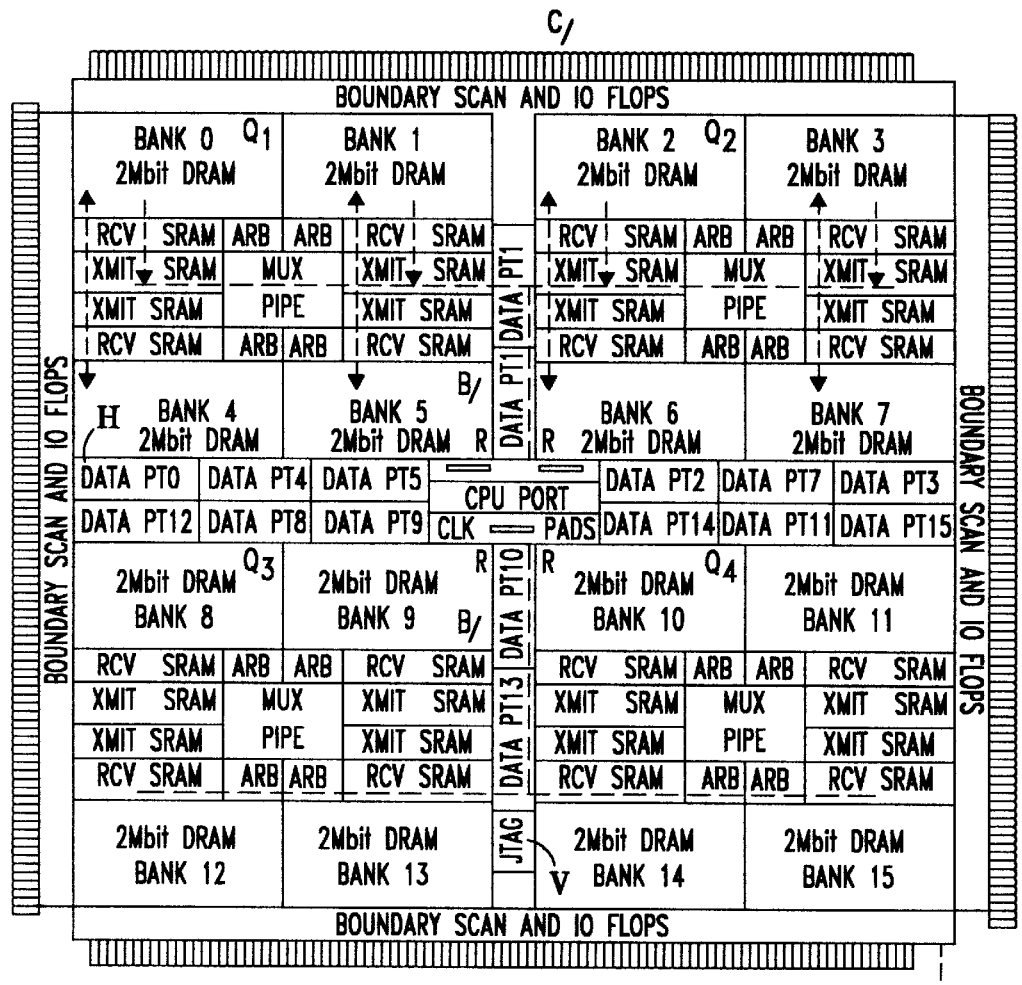

CHIP LAYOUT FOR IMPLEMENTING ARBITRATED HIGH SPEED SWITCHING ACCESS OF PLURALITIES OF I/O DATA PORTS TO INTERNALLY CACHED DRAM BANKS AND THE LIKE

The present invention relates to microelectronic chips for enabling high speed I/O data port communication with network DRAM banks, and the like, being more particularly, though not exclusively, directed to chip layouts particularly tailored for operation with the universal multi-port internally cached DRAM bank high speed switching techniques described in Mukesh Chatter U.S. Pat. No. 5,799,209 and published in PCT publication document WO97/24725.

BACKGROUND

Many approaches have been used for the layout of various types of network switching and communication chips. Prior chip layout schemes have not, however, been suited to accommodating the operation and extremely high switching speeds and other quite different characteristics of the above-mentioned Chatter, universal multi-port internally cached DRAM bank operation. In such, wherein there is provided a switching module logic control for connecting any of the I/O resources through serial interfaces with any I/O resource buffer competing for access to a common bus under a dynamic configuration of switching allocation appropriate for the desired data routability among the interfaces—with the switching module assigning any buffer to any serial interface and without any intermediate step of data transfer—prior chip layout schemes have not been suited to accommodating this operation and the extremely high switching speeds attainable therewith. The common bus access competition may be with an external competing CPU or similar control data ports, if used, competing for common system bus access with the I/O data resources serially interfaced with the internally cached DRAMs, sometimes referred to as "macros", and/or the competition of the I/O resource data buffers themselves for access to a common internal line bus within the DRAM bank, as described in said patent.

OBJECTS OF INVENTION

A primary object of the present invention, accordingly, is to provide a new and improved chip layout particularly designed for implementing said multi-port internally cached DRAM bank high speed switching techniques and the like, and in a highly efficient and economical manner.

Other and further objects will be explained hereinafter and are more particularly pointed out in connection with the appended claims.

SUMMARY

In summary, the invention embraces, a chip layout for a network wherein pluralities of I/O data ports are each connected to transmit/receive SRAM buffer banks operable under arbitration units to access pluralities of internally cached DRAM banks via internal busses to enable switching data connections amongst all data ports through the appropriate buffers, the chip layout having, in combination, a chip surface carrying a plurality of closely packed DRAM banks, data ports, SRAM buffer banks, arbitration units and busses therefor, and along the outer peripheral edges of which 110 connector pins are positioned; each of the DRAM banks being provided with its own transmit/receive SRAM buffer bank and positioned with respect thereto on the chip to allow the shortest length for communication with its buffer bank busses; half of the DRAM banks being distributed in spaced symmetrical rows in the upper half of the chip, and the other half of the DRAM banks being distributed in symmetrical rows in the lower half of the chip; the data ports being positioned along vertical-horizontal cross arms dividing the chip surface into symmetrical quadrants, each containing a quadrant of the DRAMs; the receive and transmit SRAM buffer banks of each DRAM being located in the space between the DRAMs in each quadrant such that the buffer banks of adjacent DRAMS are adjacent to one another; an arbitration unit positioned adjacent each receive SRAM buffer bank for each DRAM and contiguous with the arbitration unit of the next DRAM, with data ports substantially symmetrically placed, and with each data port connected to each arbitration unit and each transmit/receive buffer bank; each data port being enabled to write into any DRAM bank by connections effected such that each data port is substantially symmetric with respect to the DRAM bank, arbitration unit and transmit/receive buffer banks and busses; and with timing clocks centrally placed to minimize clock skew by symmetric clock distribution.

Preferred and best mode chip designs and configurations are later detailed.

DRAWINGS

The invention will now be explained in connection with the accompanying drawing, the single FIGURE of which illustrates the novel chip layout in preferred form.

PREFERRED EMBODIMENT(S) OF INVENTION

As may be gathered from the previous description, the invention is primarily directed to a chip layout particularly tailored for networks wherein pluralities of I/O data ports are each connected to buffer banks, as of the transmit/receive static RAM or SRAM type, operable under arbitration units to access pluralities of internally cached DRAM banks via internal busses to enable switching data connections at very high speeds amongst all the data ports through serial interfaces with any of the buffers under a dynamic switching allocation configuration. In the Chatter technology, external CPU or similar external data port control is useful, though internal control may also be employed, all as described in detail in the cited Chatter documents, above.

The drawing shows a preferred layout or "floor plan" for the above components as used in the Chatter system; it being understood that all the detailed circuit connections described in said documents and known and understandable by those skilled in this art, are not therein shown, not only to avoid cluttering the drawing and confusing the important chip layout design features which underlie the invention, but because it is the novel layout positioning and symmetry of the chip itself that constitutes the improvement of this invention.

We shall accordingly first proceed to describe that layout and then to discuss the operational features. Along the four sides of the preferably square chip C are shown the arrays of connector pins to the various "boundary scan and I/O Flops", so labeled, for connecting the chip with the network system in conventional fashion. A plurality of 16 I/O data ports ("DATAPT numbered PT0 through PT15") is exemplarily shown along each arm of the vertical and horizontal H cross dividing the square into four equal quadrants Q1–Q4. The numbers of these ports are not consecutive for reasons later explained, but each port, however, is to be connected to the before-mentioned corresponding SRAM transmit/receive buffer banks ("XMIT SRAM", "RCV SCRAM"—also 16 in number in this illustration) operable under arbitration units ("ARB") to access pluralities of the internally cached DRAM banks ("Banks 0–15") via internal busses (schematically represented at "B") to enable switching data connections amongst all data ports through the appropriate buffers, as earlier noted.

The upper chip surface is one of a plurality (say, five) of stacked substantially square conducting surfaces (such as metal plate surfaces), upon the upper surface of which the DRAM banks, data ports, SRAM buffer banks and arbitration units are mounted, and along which the before-mentioned outer peripheral edge connector pins are positioned. Each DRAM bank (shown as of "2 Mbit") is provided with its own transmit/receive SRAM buffer bank and positioned, as shown, closely adjacent with respect thereto to allow the shortest length for communication with its buffer bank busses (256 bits). Half of the DRAM banks are distributed in spaced symmetrical rows in the upper half of the upper or outer chip surface (Banks 0–3 at the top row and 4–7 below), and the other half of the DRAM banks (8–11 and 12–15) are distributed in symmetrical rows in the lower half of the upper part of the chip. With the data ports being positioned along the vertical-horizontal cross arms dividing the chip surface into symmetrical quadrants, as before described, each quadrant of the DRAM contains two half-rows of 4 DRAMS. Quadrant $Q_1$, for example, contains DRAM Banks 0 and 1 in the top row; and Banks 4 and 5 in the lower row. The receive and transmit SRAM buffer banks of each DRAM are located in the space between the DRAM half-rows in each quadrant, such that the buffer banks of the DRAMS in the adjacent rows are immediately adjacent one another. An arbitration unit ("ARB") is positioned adjacent each receive SRAM buffer bank for each DRAM, and contiguous with the arbitration unit of the next DRAM in each row, with the data ports substantially symmetrically placed, and with each data port connected to each arbitration unit and each transmit/receive buffer bank as described in said Chatter documents. Each data port is thus enabled to write into any DRAM bank, with the connections being effected such that each data port is substantially physically symmetric with respect to DRAM bank, arbitration unit and transmit/receive buffer banks and busses. Timing clocks ("Clk") are centrally placed to minimize clock skew by symmetric clock distribution. A central CPU port is also provided, so-labeled, symmetric with respect to the DRAM banks, arbitration units and transmit/receive buffer banks. Repeater buffers R are also inserted centrally to achieve substantially symmetrical data transfer for the longer connections, as later more fully discussed.

The CPU port provides a diagnostic and control feature in this chip, whereby the control processor can examine the buffers and the status of each DRAM bank; i.e. where the data is, etc.—in short, providing a two-way communication window into the chip. Placing the CPU port right in the middle of the chip, moreover, guarantees that it has symmetric access to all the data. Pad transfer wires (such as C4 package pads) for achieving connectivity at the chip package level are also positioned centrally (shown as "pads").

An example of operation, as fully explained in the referenced Chatter documents, may involve sending data in, say, dataport 0 ("DATA PT0"), intended for DRAM "Bank 14" at the lower right of the chip in the drawing to the receiver SRAM ("RCV SRAM") right at the top of DRAM Bank 14, and into an allocated slot reserved for dataport 0. Each dataport, indeed, is connected to each receive SRAM where there is a reserved location for each dataport—17 slots, one dedicated for each of the 16 dataports and one dedicated to the CPU port. This affords each data port the capability to write into any DRAM bank, with arbitration—the gatekeeper—determining which one of these ports enters the DRAM bank in the next time slot. The data may go from the receiver SRAM into the DRAM in one shot into 256 bit wide busses, with the very short-distance adjacent positioning of the receiver SRAM and its DRAM bank on the chip enabling the choice of the 256 bit wide busses very close to the respective DRAM bank. In the other direction, when taking data out of the DRAM bank, the data goes first to the transmitter SRAM ("XMIT SRAM") placed immediately adjacent that DRAM bank, with the short connection obviating any data meandering through the chip.

There is also provision, as explained in the previously referenced Chatter documents, for partial use of the 256 byte bus, not wasting memory. At any given instance, however, for this example, there can be 256×16 (number of banks) switching, and each transmitting data into a 256 bit bus; all switching independently of one other, and giving rise to the very high speed of switching described in said patent.

Considering chip sizes of roughly, say, 16×16 millimeters, there are connection paths of varying lengths. From Bank 0 to dataport 0 therebelow ("DATA PT0"), there is a much shorter connection path length than to data port 15 ("DATA PT 15") at the far right. As before mentioned, repeater buffers R are accordingly provided, positioned, in accordance with the chip layout philosophy of the present invention, near the middle of the chip to boost the data signal before it gets to its final destination, and thereby achieving more substantially symmetrical data transfer for the longer connections. There is thus a range within which the terms symmetry or "symmetric", as herein used, applies, all such requiring signal completion, however, within a clock cycle.

With the clocks ("Clk") positioned in the middle of the chip in accordance with the invention, as before noted, symmetric clocking distances are also achieved. Local interconnections are mainly accomplished in two surface layers (1,2) of metal in the stacked chip block assembly, (schematically so-labeled in the drawing), with all interconnections required within the block (internal) taken to terminal accessibility, and which are interconnected locally with the components on the upper chip layer, as by well known techniques. At the global level, three metal surface layers (3, 4 ,5), mainly the fourth and fifth layers, are available to make the longer wire hookup or connections. The fifth layer of metal, (5), is convenient for the clock routing and ground connections.

Summarizing the chip physical layout and design of the present invention for realizing the intended Chatter architecture with available semiconductor technologies, the following are the features of the design, of the technology, and of the floorplan features and decisions as previously discussed:

Features of the Design of the Invention:
1. Each dataport is symmetric with respect to the DRAM bank, arbiter and xmit/receive buffer banks.
2. The CPU port is symmetric with respect to the DRAM bank, arbiter and xmit/receive buffer banks.
3. Each dataport is connected to each arbiter and each of the xmit/receive buffer banks of the system.
4. Each dataport can write into any DRAM bank.
5. Each DRAM bank communicates with its own xmit/receive buffer bank 256 bit wide busses.

Features of the Technology:
1. The DRAM macros can not be rotated. They can be flipped.

2. 5 metal surfaces or layers are assembled in a stack for the chip block with enabling local and global routing availability.
3. Long metal lines with lengths of 10–12 mm will have high RC drops.
4. C4 package pads need pad transfer wires to achieve connectivity at package level.

Floorplan Features and Decisions:
1. Combination of DRAM bank with its own
   a) xmit/receive buffer bank, allowing shortest length for 256 bit busses
   b) Arbiter
2. Symmetric placement of dataports
3. Symmetric placement of repeater buffers R for the long lines
4. Central placement of CPU port
5. Central placement of clocks Clk to maintain clock skew by symmetric clock distribution
6. Routing of individual blocks in mainly metal layers 1 and 2 and 3
7. Metal layers 4 and 5 reserved for global routing
8. Metal layer 5 also used for power and ground, clocks and pad transfer traces
9. Power and ground balls of the package fully utilized for robust power and ground distribution by the $5^{th}$ layer of metal While the invention has been described in terms of the chip design layout for the preferred internally cached DRAM switching system, it is to be understood that its features may also be useful for layout and operating of related networked switching and similar systems, as well, where the same advantages or some of them, are desired; also, that the illustrative values of numbers of banks, dataports, etc. and of high-frequency switching values, while presently preferred, are illustrative only, and may be scaled upward or downward, as desired; and such and other modifications as will occur to those skilled in this art are considered to fall within the spirit and scope of the invention as defined in the appended claims.

What is claimed is:

1. A chip layout for a network wherein pluralities of I/O data ports are each connected to transmit/receive SRAM buffer banks operable under arbitration units to access pluralities of internally cached DRAM banks via internal busses to enable switching data connections amongst all data ports through appropriate buffers, the chip layout having, in combination, a chip surface carrying a plurality of closely packed DRAM banks, data ports, SRAM buffer banks, arbitration units and busses therefore, and along outer peripheral edges of the chip layout of which I/O connector pins are positioned; each of the DRAM banks being provided with its own transmit/receive SRAM buffer bank and positioned with respect to the buffer bank on the chip layout to allow the shortest length for communication with its buffer bank busses; half of the DRAM banks being distributed in spaced symmetrical rows in upper half of the chip layout, and other half of the DRAM banks being distributed in symmetrical rows in lower half of the chip layout; the data ports being positioned along vertical-horizontal cross arms dividing the chip surface into symmetrical quadrants, each quadrant containing a quadrant of the DRAMs; the transmit/receive SRAM buffer bank of each DRAM being located in the space between the DRAMs in each quadrant such that the buffer banks of adjacent DRAMS are adjacent to one another; an arbitration unit positioned adjacent each transmit/receive SRAM buffer bank for each DRAM and contiguous with the arbitration unit of the next DRAM, with data ports substantially symmetrically placed, and with each data port connected to each arbitration unit and each transmit/receive buffer bank; each data port being enabled to write into any DRAM bank by connections effected such that each data port is substantially symmetric with respect to the DRAM bank, arbitration unit and transmit/receive buffer banks and busses; and
   with timing clocks centrally placed on the chip layout to minimize clock skew by symmetric clock distribution.

2. A chip layout as claimed in claim 1 wherein a central CPU port is provided symmetric with respect to DRAM banks, arbitration units and transmit/receive buffer banks.

3. The chip layout as claimed in claim 2 wherein the central CPU port is connected to provide diagnostic and control features in the chip layout.

4. A chip layout as claimed in claim 1 wherein repeater buffers are inserted to achieve substantially symmetrical data transfer for longer connections.

5. The chip layout as claimed in claim 4 wherein the repeater buffers are symmetrically positioned near the center of the chip layout.

6. A chip layout as claimed in claim 1 wherein a chip block assembly of five stacked metal surface layers is provided, and wherein metal layers 1, 2 and 3 are provided with connections for routing locally within the chip block assembly.

7. A chip layout as claimed in claim 6 wherein $4^{th}$ and $5^{th}$ metal layers are provided with global routing connections.

8. A chip layout as claimed in claim 7 wherein the $5^{th}$ metal layer is provided with power, ground and clock connections.

9. A chip layout for a network wherein pluralities of I/O data ports are each connected to transmit/receive SRAM buffer banks operable under arbitration units to access pluralities of internally cached DRAM banks via internal busses to enable switching data connections amongst all data ports through appropriate buffers, having, in combination, a chip surface carrying a plurality of closely packed DRAM banks, data ports, SRAM buffer banks and arbitration units and busses therefor, and along outer peripheral edges of the chip layout of which I/O connector pins are positioned; each of the DRAM banks being provided with its own transmit/receive SRAM buffer bank and positioned with respect to the buffer bank on the chip layout to allow the shortest length for communication with its buffer bank busses; the data ports being positioned along vertical-horizontal cross arms symmetrically dividing the chip surface into four quadrants each quadrant containing symmetrically disposed DRAM units each of which abuts its transmit/receive, SRAM buffer bank and arbitration unit, and with the data ports substantially symmetrically placed with each data port connected to each arbitration unit and each transmit/receive buffer bank; and each data port being enabled to write into any DRAM bank, with connections being effected such that each data port is substantially symmetric with respect to the DRAM bank, arbitration unit and transmit/receive buffer banks and busses.

10. A chip layout as claimed in claim 9 wherein a central CPU port is provided symmetric with respect to DRAM banks, arbitration units and transmit/receive buffer banks.

11. A chip layout as claimed in claim 9 wherein repeater buffers are inserted for longer connections to achieve substantially symmetrical data transfer.

12. A chip layout as claimed in claim 9 wherein timing clocks are centrally placed to minimize clock skew by symmetric clock distribution.

13. A chip layout as claimed in claim 9 wherein 16-DRAM units are provided, a set of four symmetrically disposed in each quadrant.

14. A chip layout as claimed in claim 13 wherein the transmit/receive buffer banks are disposed physically to separate the DRAMs of each set on the chip layout.

* * * * *